United States Patent
Paciaroni et al.

(10) Patent No.: US 8,458,643 B2
(45) Date of Patent: Jun. 4, 2013

(54) INTEGRATED CIRCUIT DESIGN FRAMEWORK COMPRISING AUTOMATIC ANALYSIS FUNCTIONALITY

(75) Inventors: Luciana Paciaroni, Rho (IT); Antonio Bogani, Limbiate (IT); Paolo Cacciagrano, Cairate (IT); Marco Verga, Bollate (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 13/158,656

(22) Filed: Jun. 13, 2011

(65) Prior Publication Data

US 2012/0079438 A1    Mar. 29, 2012

(30) Foreign Application Priority Data

Jun. 11, 2010   (IT) ................ VI2010A0166

(51) Int. Cl.
*G06F 17/50*    (2006.01)
(52) U.S. Cl.
USPC ............ 716/136; 716/106; 716/111; 716/115
(58) Field of Classification Search
USPC .................. 716/106, 111, 115, 136
See application file for complete search history.

(56) References Cited

U.S. PATENT DOCUMENTS

| | | | |
|---|---|---|---|
| 6,983,434 B1 * | 1/2006 | Frank et al. ................ | 716/112 |
| 2002/0194575 A1 * | 12/2002 | Allen et al. .................. | 716/17 |
| 2004/0243373 A1 * | 12/2004 | Sercu et al. .................. | 703/14 |
| 2005/0055650 A1 * | 3/2005 | Lin et al. ..................... | 716/5 |
| 2008/0148199 A1 * | 6/2008 | Bell et al. .................... | 716/5 |
| 2008/0209367 A1 * | 8/2008 | Mukai ......................... | 716/4 |
| 2009/0031264 A1 * | 1/2009 | Rittman et al. ............... | 716/5 |
| 2009/0293033 A1 * | 11/2009 | Ito ................................ | 716/6 |

OTHER PUBLICATIONS

Search Report for Italian Application No. VI20100166, Ministero dello Sviluppo Economico, Munich Feb. 23, 2011, pp. 7.

* cited by examiner

*Primary Examiner* — Vuthe Siek
(74) *Attorney, Agent, or Firm* — Graybeal Jackson LLP

(57) ABSTRACT

An embodiment of an integrated circuit design framework comprises a user interface which automatically initializes a three-dimensional simulation tool for simulating or analyzing the characteristics of a complex metallization system. In some illustrative embodiments the user interface may additionally provide electrically simulated parameter values for an input parameter, such as the channel resistance of a power transistor, thereby enabling a simulation of a portion of interest of the metallization system without actually requiring the provision of the design data of the power transistor.

42 Claims, 4 Drawing Sheets

INTEGRATED CIRCUIT DESIGN FRAMEWORK COMPRISING AUTOMATIC ANALYSIS FUNCTIONALITY

PRIORITY CLAIM

The instant application claims priority to Italian Patent Application No. VI2010A000166, filed Jun. 11, 2010, which application is incorporated herein by reference in its entirety.

TECHNICAL FIELD

An embodiment generally relates to the field of design and analysis of integrated circuits prior to actually implementing the integrated circuit in a semiconductor chip, wherein the design and analysis functionality is provided on the basis of computer aided design and analysis tools.

BACKGROUND

Integrated circuits are formed on appropriate substrate materials, such as semiconductor materials and the like, in and on which a plurality of circuit elements in the form of transistors, resistors, capacitors and the like are manufactured on the basis of the desired technology. The semiconductor industry has experienced great advances in terms of manufacturing techniques, process tools, metrology procedures, design strategies and the like. For example, integrated circuits comprising millions of transistors are currently available, thereby enabling the implementation of extremely complex functions into a single semiconductor device. One important aspect in fabricating complex integrated circuits has been the continuous reduction of the feature sizes of the circuit elements, wherein currently critical dimensions of 50 nm and less are realized in sophisticated circuits, such as CPUs (central processing units), complex memory devices and the like. Moreover, in addition to increasing the number of individual circuit elements by reducing the critical feature sizes, very different types of circuit elements are increasingly provided in the same semiconductor substrate, which offers the possibility of implementing a plurality of different functions into a single semiconductor device. Consequently, by combining various types of electronic circuits, such as control circuitry, power circuitry and the like, entire systems may be formed on a single chip.

For example, semiconductor devices comprising complex control functionality in combination with power circuitry are increasingly used in many fields are typically referred to as smart power applications, since a plurality of intelligent features may be implemented into the semiconductor device in order to ensure the proper operational behavior of critical circuit portions such as power transistors and the like, under any circumstances. For example, in addition to providing the required periphery for reliably operating a power transistor, additional sensors and monitor structures may be implemented in order to reduce the probability of device failures, which may be caused by non-predictable events, such as signal interference caused by electrical noise, over temperature situations, over voltage and over current situations, etc. In this manner, not only very complex circuit functions may be realized but also operation of the device may be controlled by device internal functional blocks, thereby contributing to superior reliability of integrated circuits. Consequently, specifically designed integrated circuits may be applied also in critical technological fields which require a high degree of failure immunity, such as automotive applications and the like.

Due to the advance in process technologies and material systems used for the fabrication of sophisticated semiconductor devices, the operational behavior of complex semiconductor devices may not only be determined by the semiconductor based circuit elements themselves, i.e., by transistors, resistors, capacitors and the like, but the wiring system or metallization system of the semiconductor device also represents an important component that significantly determines reliability and performance of the overall semiconductor device. For example, upon implementing fast logic circuitry on the basis of CMOS technology based on field effect transistors having a gate length of 100 nm and less, the switching speed of these transistors may no longer significantly represent the limiting factor of the overall performance of the logic circuitry. Rather, the metallization system may significantly contribute to the signal propagation delay and may thus represent the actual limiting factor in view of overall performance of complex semiconductor devices. Similarly, the metallization system associated with a power transistor has great influence on the finally obtained drive current and switching behavior.

Typically, a metallization system of a complex semiconductor device comprises a plurality of metallization layers or levels, which may be understood as layers including appropriately designed conductor portions, for instance in the form of metal lines and the like, which are embedded in appropriate dielectric material. Furthermore, the metallization system comprises a plurality of "vertical" interconnect structures, for instance referred to as vias, which provide the electrical connection between the individual stacked metallization layers. Due to the increased packing density of circuit elements in the semiconductor material of the semiconductor device, also the number of required electrical connections per unit area in the metallization system is increased, which is typically accomplished by reducing the lateral dimensions of the metal features and/or by providing an increased number of stacked metallization layers. Any of these design measures is, however, typically associated with an increase of parasitic parameters, such as parasitic resistance in the metallization system, the parasitic capacitance between closely spaced metal regions, parasitic inductance values and the like.

Consequently, new processes and material systems may typically be implemented in the metallization system in an attempt to further reduce any parasitic effects. For example, frequently highly conductive materials, such as copper, may be used so as to provide for superior performance in terms of conductivity and electromigration compared to, for instance, other well-established metals such as aluminium. Furthermore, the dielectric constant of the dielectric materials in the metallization layer may be reduced, for instance by using so-called low-k dielectric materials, for instance having a dielectric constant of 3.0 or less and the like, wherein any such additional measures may not only affect electrical performance of the metallization system but may also influence other factors such as heat dissipation capability, mechanical strength, electromigration behavior and the like.

Typically, several hundred individual production processes and metrology procedures are required for completing a moderately complex semiconductor device, each of which may itself represent a complex process wherein a typical overall process time from launching a semiconductor substrate into the semiconductor facility until obtaining a packaged semiconductor device may typically be in the range of several months. Hence, in view of economic constraints and taking into consideration these extended overall process times the verification of performance characteristics of a newly designed integrated circuit cannot exclusively rely on the fabrication of a dedicated test chip which may, after completely passing through the manufacturing process, be tested so as to identify any flaws in the overall design and the actual silicon implementation.

For these reasons, the design phase has increasingly gained in importance and actually represents a critical part of the overall manufacturing process, which may thus significantly affect the economic success of a newly designed semiconductor product that is to be placed on the market. During the design of the integrated circuit under consideration an appropriate geometric representation or layout of the various device layers are established on the basis of the specifications with respect to the electrical behavior of the circuit under consideration. Furthermore, other requirements to be met by the product are for instance the required silicon area in the semiconductor chip, which may also affect the layout, i.e. the geometric configuration of the various features in the device layers including the metallization layers of the semiconductor device. For example, a reduced chip area which may typically allow the processing of an increased number of semiconductor chips per each process step is typically associated with a more sophisticated technology, which in turn may affect the overall production costs, the reliability of the device, for instance in terms of heat dissipation capability, electromigration, and the like. Thus, many of the design requirements may represent a compromise between performance and cost considerations.

After the verification of the circuit function, for instance based on the circuit schematic, also a simulation of the behavior of the semiconductor device may be performed on the basis of the design data, i.e. the layout data or any other data correlated thereto, in combination with additional information, such as type of technology used and the like, in order to identify any failures or weaknesses of the current design of the integrated circuit under consideration, without actually requiring the fabrication of a dedicated test chip. Consequently, a plurality of analysis tools have been developed so as to provide a design framework with additional capabilities in order to identify critical factors of the current design status, thereby significantly reducing the time for establishing an appropriate redesign version of the product in order to compensate for at least some of the previously identified design errors. With the significant reduction and thus increase of the packing density of sophisticated integrated circuits, however, significant resources may be required, in particular for determining the operational behavior of the complex metallization system, which may be understood as a three-dimensional system including a plurality of objects which may have a more or less pronounced electrical, mechanical and thermal coupling to each other. For these reasons, powerful analysis tools have been developed in order to "simulate" the characteristics of metallization systems, for instance for determining parasitic parameters, such as resistance, capacitance, inductance and the like. For example, sophisticated analysis tools, which will also be referred to herein as simulation tools, are available from "Silicon Frontline", in which for instance the current flow may be calculated for appropriately selected unit volumes in the metallization system on the basis of finite element techniques by solving the Laplace differential equations. Based on any such sophisticated simulation tools for determining the operational behavior of complex metallization systems, for instance the critical resistance of power devices, such as power MOS transistors and the like, may efficiently be determined for Smart Power applications in which the electrical performance of the power device is one dominant aspect of the semiconductor device. When using the sophisticated simulation tool, for instance the "Silicon Frontline" tool, the design engineer is confronted with a complex task in view of properly initializing the simulation tool on the basis of appropriate design data obtained by using a dedicated process design kit (PDK), in which the actual layout data and any other required data files have been generated on the basis of the basic schematic of the desired electronic circuit. That is, upon initializing the simulation tool the various data files and design data are identified in the computer system, in which the design framework is implemented and also the complete database for the integrated circuit under consideration is created and is appropriately addressed by the design engineer.

To this end, a configuration file is compiled in a proper manner so as to comply with the requirements of the simulation tool used. Thus, the configuration file includes the various access paths in order to access the required data files and the data base created for the subsequent simulation, while also the various initialization data for the actual physical simulation are entered into the configuration file, wherein all the information of the configuration file is provided on the basis of a specific format required by the simulation tool. Consequently, the complex flow for initializing the physical simulation of a complex metallization system may require significant efforts for the designer which may thus result, in addition to the need for increased manpower, in a high probability of creating additional errors in specifying input information for the extraction and simulation of critical parameters, such as the local resistance of complex metallization systems and the like.

SUMMARY

In view of the situation described above, an embodiment is a design framework with integrated simulation and extraction capabilities, while at the same time the probability of causing mistakes and also the required process time may be reduced.

According to an embodiment, an integrated circuit design framework comprises a process design kit implemented in a computer system, wherein the process design kit is configured to create design data for an integrated circuit based on at least a predefined functional behavior of the integrated circuit. The integrated circuit design framework further comprises a simulation tool implemented in the computer system and configured to determine a distribution of at least current values and potential values in a metallization system of the integrated circuit. Moreover, the design framework comprises a user interface implemented in the computer system and configured to receive a user input and to initialize the simulation tool by using the user input and the design data created by the process design kit.

An embodiment of the design framework thus provides an efficient environment for the design engineer in order to appropriately simulate and thus analyze the metallization system of the integrated circuit, or at least a portion thereof. To this end, the user interface automatically handles the access by the simulation tool to the design data, while the actual user input may require the provision of only some basic parameter values, thereby significantly reducing the probability of creating any errors in initializing the simulation tool in contrast to conventional strategies in which the compilation of the configuration file is performed by the design engineer. Consequently, any input information for extraction and simulation of parameters of the metallization system, or a part thereof, may be specified while reducing the complexity of the overall initialization event at the user side. Furthermore, the simulation and thus analysis of the metallization system or a portion thereof may be performed in a more standardized manner due to the significant reduction of input parameters entered into the design framework by means of the user interface.

In an embodiment, the user interface is further configured to enable access to each one of a plurality of data files of the design data as required by the simulation tool and the interface is further configured to create from the design data a database as required by the simulation tool. Consequently, the complex task of identifying the required data files and determining the corresponding access paths within the computer system is performed by the user interface. Similarly, the creation of the database including layout data in any appropriate format is automatically initiated by the user interface without requiring any user interaction. Therefore, the selection of any specific design data files, for instance with respect to different technologies to be applied to the circuit schematic under consideration and the like, may be accomplished on the basis of a simple selection by the user via the user interface, while the complex task of appropriately linking the data files and the database with the simulation tool is accomplished via the user interface.

In an embodiment, the process design kit is configured to create the design data so as to represent a complete design of the integrated circuit. In this case, an efficient simulation and thus analysis of the metallization system may be based on all components of the metallization system, which may require extended computer process time of the computer system wherein, contrary to conventional strategies, the efficient automatic initialization of the simulation tool ensures efficient utilization of the resources of the simulation tool due to the avoidance of errors upon initializing the simulation tool.

In an embodiment, the process design kit is configured to create the design data so as to represent a preselected portion of the metallization system of the integrated circuit. In this case, an appropriate simulation and thus analysis of a portion of interest of the metallization system may be performed with high efficiency, wherein the efficient initialization of the simulation tool by means of the user interface enables a time efficient usage of the design framework. For example, the design framework may comprise in its process design kit a power device generator tool in which the layout of any power devices, such as transistors, may be established in an automatic manner with an intermediate step in which only the relevant portion of the metallization system of the power device is provided. In this manner, a critical part of the metallization system of the entire integrated circuit may be provided, for instance prior to actually determining the complete layout of the metallization system thereby providing, in combination with the efficient initialization of the simulation tool, the possibility of determining specific characteristics, such as the resistance of a conductive path coupled to the power device, for various layout versions in order to identify a layout that meets the design targets. Consequently, an optimized layout for a critical portion of the metallization system may be provided at an early stage of the entire design phase, thereby reducing the overall design time since the most error-prone portions of the metallization system may already have a desired "optimum" configuration.

In an embodiment, the design framework further comprises a data storage unit configured to store a plurality of simulation results, wherein each of the plurality of simulation results corresponds to a different design version of the preselected portion of the metallization system. In this manner, the comparison of various modified layout versions may be compared in view of electrical characteristics obtained by the various simulation runs.

In an embodiment, the design framework further comprises a second simulation tool that is implemented in the user interface and is configured to determine default data of a part of the design data required by the simulation tool. That is, the simulation tool, which may perform a three-dimensional analysis of the metallization system or a portion thereof, may require specific input data, for instance the channel resistance of a power transistor and the like, which are typically contained in the design data obtained on the basis of the process design kit. In some cases, it is desirable to use design data that differ from any design data already obtained or which may represent the parameter under consideration for adapted or modified specifications, for instance in terms for differing operating conditions, and the like. In other cases the corresponding design data may not yet have been established, for instance, in a situation when the layout of the dedicated portion of the metallization system has been established without providing the complete layout of the integrated circuit under consideration. In this case, the second simulation tool provides default "design data", i.e. appropriate values for required input parameters such as the channel resistance of a transistor, by performing an electrical simulation on the basis of the circuit schematic in combination with other parameters, such as environmental parameters in the form of temperature and the like. In this manner, the user interface itself creates correct input data for required parameters, such as the channel resistance, by using the second simulation tool thereby contributing to an overall efficient design flow by saving the time for the development of the technological files via the process design kit.

A further embodiment is a method of designing an integrated circuit. The method comprises providing design data in a computer system wherein the design data represents at least a portion of the metallization system of the integrated circuit. Moreover, the method comprises entering user data into the computer system via a user interface wherein the user data initializes, via the user interface, at least a simulation tool implemented in the computer system. The method further comprises performing a simulation of at least the portion of the metallization system by using the design data and the user data. Thus, as also previously discussed above, a method enables a very efficient design of integrated circuits on the basis of a significantly reduced number of user input parameters, since a complex process for initializing the simulation tool is performed in an automated manner by the user interface.

In an embodiment, the step of initializing the simulation tool comprises the steps of automatically creating a database for at least the portion of the metallization system via the user interface, compiling a configuration file via the user interface and providing the configuration file to the simulation tool. Consequently, the required set of data may be created or accessed via the user interface without any user interaction.

In a further embodiment, the step of providing the design data comprises the steps of: selecting a portion of interest of the metallization system, creating design data of the portion of interest prior to creating design data of non-selected portions of the integrated circuit, and performing the simulation on the basis of the design data of the selected portion of interest. Thus, as also discussed above, layout data of one or more relevant portions of the metallization system may be obtained in advance and may thus be the subject of simulation or analysis, wherein the efficient initialization of the simulation process significantly contributes to an overall reduced design time.

In a still further illustrative embodiment, a method comprises a step of providing at least one item of the design data of the integrated circuit by performing an electrical simulation process initiated by the user interface. As also explained above, any required parameters may be determined on the basis of the electrical simulation process, which may efficiently be embedded into the user interface. For example, the channel resistance of a transistor, such as a power transistor, may efficiently be determined for any desired range of operating conditions without requiring establishing any associated technology files.

According to a further embodiment, a computer program product is provided, which comprises instructions that when executed by a computer system cause the computer system to perform a design method as specified above.

BRIEF DESCRIPTION OF THE DRAWINGS

Illustrative embodiments are described in the following detailed description, which refers to the attached drawings in which.

DETAILED DESCRIPTION

Figure 1A:
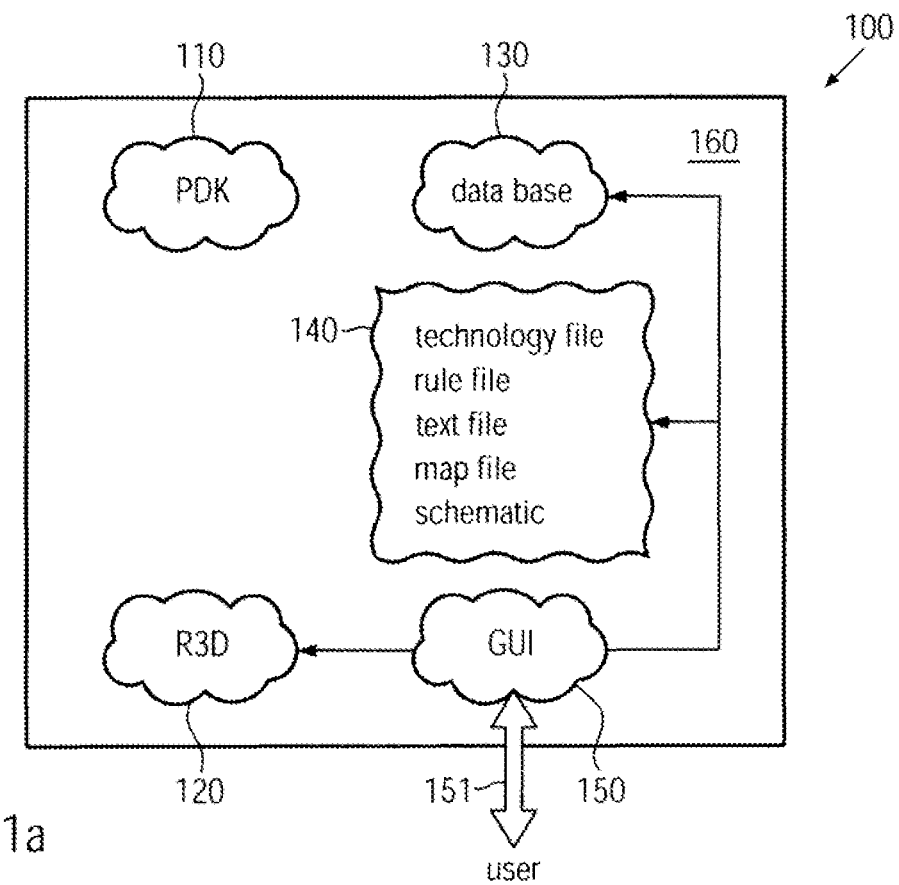
FIG. 1a schematically illustrates a design framework comprising a user interface for initialization of a three-dimensional simulation tool for estimating characteristics of the metallization system according to illustrative embodiments.

FIG. 1a schematically illustrates an integrated circuit design framework 100 which is implemented in a computer system 160 having any appropriate configuration. The computer system 160 may comprise any appropriate components, such as a CPU, a working memory, appropriate interfaces for connecting to peripheral components and the like, in order to provide the required resources for implementing the design framework 100. In some illustrative embodiments the design framework 100 may be established on the basis of the "Cadence Design Framework" which provides, when implemented in the computer system 160, the resources for establishing a process design kit 110, which may provide corresponding design data represented by a database 130 and corresponding design data files 140. The database 130 may be provided in any appropriate format, for instance in the form of layout data using the Gerber format and the like. Similarly, the design data files 140 may comprise any required information with respect to technology, which may be understood as information with respect to material systems used, critical dimensions of circuit features such as semiconductor-based circuit elements, metal lines, vertical interconnects or vias in the metallization system, the corresponding layer thickness of the metallization layers and the like.

Furthermore, the design data files 140 may comprise a rule file for describing derived layers and basic layers. Furthermore, any text information may be included in the design data files 140 and a relation between layers specified in the technology file and any derived layers obtained on the basis of the rule file may be contained in a map file. Moreover, any schematics may be provided in order to enable a layout versus schematic (LvS) comparison, the results of which may also be used for establishing an appropriate database, which may be operated on by a three-dimensional simulation tool 120. The simulation tool 120, which may also be referred to as an analysis tool, may be implemented on the basis of any available efficient three-dimensional simulation systems, wherein in one illustrative embodiment the tool 120 used is in the form of the "Silicon Frontline" 3D simulation tool, which may determine a mesh of values indicating the current and potential within a metallization system of an integrated circuit. Hence, also the resistance values (R) may be determined and thus the tool is also denoted as R3D in the drawings. To this end, the simulation tool 120 has access to the database 130, which is provided in an appropriate format and also has access to at least some of the design data files 140, as is also previously explained.

Furthermore, the design framework 100 comprises a user interface 150, for instance in the form of a graphical user interface, which is implemented in the computer system 160 in the context of the design framework, for instance by providing a modified window menu in the Cadence design framework in order to initialize the user interface 150 upon user request.

The basic operation of the design framework 100 will be described by also referring to FIGS. 1b and 1c.

Figure 1B:
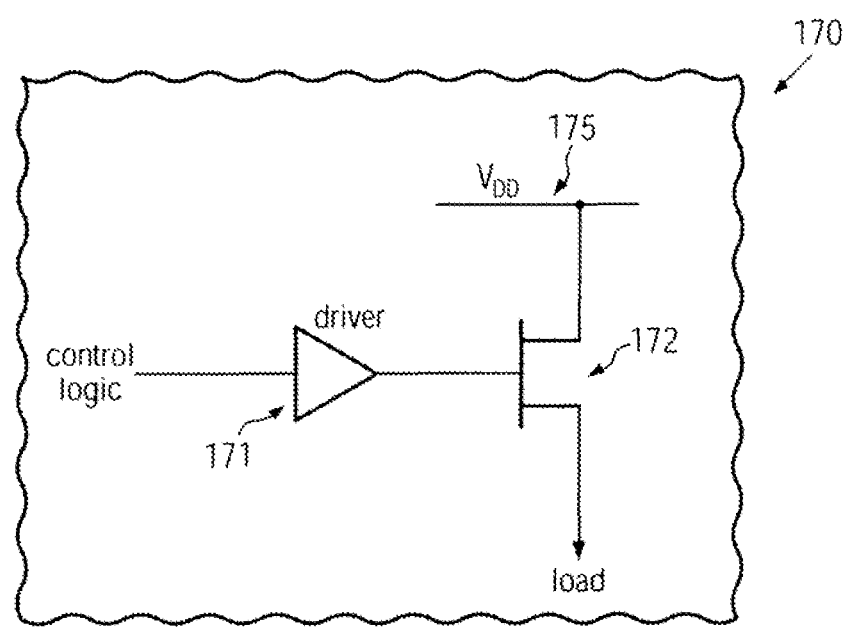
FIGS. 1b and 1c schematically illustrate a circuit schematic and a cross-sectional view, respectively, of a device layout of an integrated circuit, for instance in the form of a smart power device.

FIG. 1b schematically illustrates a portion of a circuit schematic 170 of an integrated circuit to be implemented in a semiconductor device. In this sense, the integrated circuit may be represented to a certain degree by the schematic 170 which may be illustrated in the form of a circuit diagram, for instance comprising circuit elements in the form of transistors, resistors, capacitors and the like, which are collectively indicated by reference sign 171, in order to form for instance a driver circuit, a control logic and the like, as may be required for obtaining the desired functional behavior. It is appreciated that typically very complex circuit portions are to be formed on the basis of the circuit elements 171, thereby perhaps requiring a great number of individual transistors having critical dimensions of 100 nm and less. In other cases, less sophisticated design rules may be used. In the example shown, a power device such as a power MOS transistor 172 may be provided, for instance representing a part of a Smart Power circuit, wherein the transistor 172 and an associated portion of a wiring network or metallization system 175 may represent critical portions in terms of reliability, performance and overall behavior of the integrated circuit 170, as is also described above.

Figure 1C:
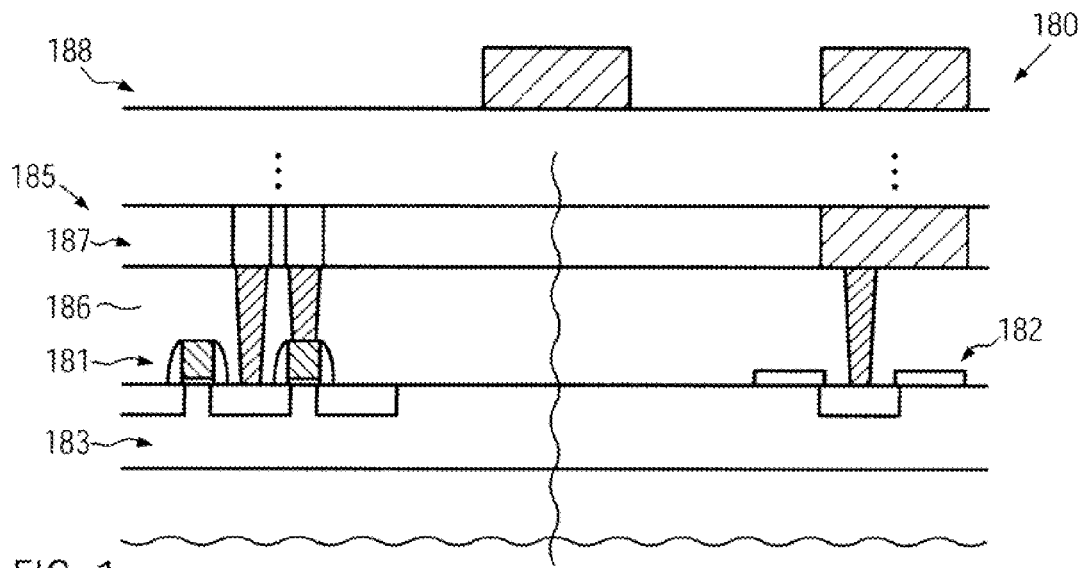

FIG. 1c schematically illustrates a cross-sectional view of an integrated circuit 180 when actually implemented in a semiconductor device. For this purpose, the integrated circuit 180 may comprise an appropriate substrate 183, for instance in the form of a semiconductor material such as silicon, in and above which circuit elements 181 may be provided so as to implement any desired circuit function, such as the functional blocks represented by the circuit elements 171 in the schematic of FIG. 1b. Furthermore, a power device or power transistor 182 may be provided wherein the circuit elements

181 and 182 are appropriately coupled by a metallization system 185, which may comprise a plurality of metallization layers 187, 188 in combination with a contact structure 186, which may comprise appropriate interconnect structures so as to directly connect to the circuit elements 181, 182. It is appreciated that the integrated circuit 180 may be fabricated on the basis of a given technology using a dedicated layout, which may be understood as the geometrical representation of the various components in each of the several device layers. For example, the lateral size and shape of any conductors in the metallization layers 187, 188 are defined on the basis of the layout data for the respective metallization layer, wherein this data may also significantly depend on the specific technology used for implementing the layout in an actual semiconductor device. For example, the critical lateral dimensions are significantly dependent on the technology node used. Also, the materials used for the conductors and the dielectric areas strongly influence the layout as, for instance, superior conductivity of the metal may allow reduced lateral dimensions.

As previously indicated, prior to actually implementing the integrated circuit 180 in a semiconductor substrate, the required design data are obtained on the basis of the design framework 100, for instance starting from the circuit schematic 170 and any other customer-specific information such as a desired technology node and the like. For this purpose, the process design kit 110 may be used by the designer in order to create the layout of the integrated circuit by using basic design blocks, which may appropriately be combined with more complex design blocks so as to finally generate a layout of the total circuit. Consequently, the process design kit 110 may produce appropriate design data, such as the database 130 and the data files 140, which may thus represent at least a portion of the input information required by the three-dimensional simulator 120. Upon initializing the interface 150, the user may be prompted to enter one or more input parameters, which may be used for initializing the three-dimensional simulation tool 120. To this end, the interface 150 is configured to access or handle at least some of the design data 130, 140 and to establish a configuration file for the simulation tool 120 without requiring specific input by the user.

For example, the interface 150 is appropriately configured to provide the database 130 with an appropriate format that may directly be used by the simulator 120. To this end, in some illustrative embodiments, the user interface 150 initiates a layout versus schematic (LvS) comparison, which may be accomplished by system internal resources of the framework 100. For example, an LvS tool available from Calibre may be used in order to provide the database 130 in the form of LvS data. Thus, upon user interaction, the interface 150 may automatically initiate the creation of the database 130 having the appropriate format for the simulation tool 120. Moreover, the interface 150 may establish the required links to the data files 140 to allow the simulation tool 120 to access the required data files 140, thereby automatically inserting the corresponding paths within the computer system 160. Additionally, any other information required by the simulation tool 120 may be provided in a corresponding configuration file, or the appropriate information for accessing these data may be provided by the interface 150. Additionally, the interface 150 may automatically start the simulation tool 120 prior upon providing the configuration file. It is appreciated that in the context of the present application the initialization of the simulation tool 120 is to be understood as starting the tool 120 and enabling any required design data to be accessed by the tool 120 when performing the simulation, wherein the user input is limited to one or only few input data 151.

During operation, the simulation tool 120 may determine the current and potential values for a plurality of positions within the metallization system of the integrated circuit, for instance of the metallization system 185 as shown in FIG. 1c, thereby providing information with respect to performance, reliability and the like, for the integrated circuit prior to actually realizing the metallization system 185 in a semiconductor device. For example, the resistance values of any "nets" within the metallization system, i.e. of any conductive paths, may be determined for a given set of design data, while in other cases the electromigration behavior may be investigated, thereby generally estimating the lifetime and reliability of the metallization system under consideration. For instance, based on the mesh of current values and potential values obtained by the simulation, the resistance within conductive paths may be determined on the basis of Ohm's Law, while in other cases positions of increased current density may be identified in order to locate hotspots in the metallization system so as to estimate overall performance of the metallization systems, for instance with respect to heat dissipation and the like. Also, appropriate positions for monitoring the device internal temperature may be identified and also a sensitivity analysis for optimizing the behavior of the conductive path under consideration may be performed, for instance modifying only one metal level.

Figure 1D:
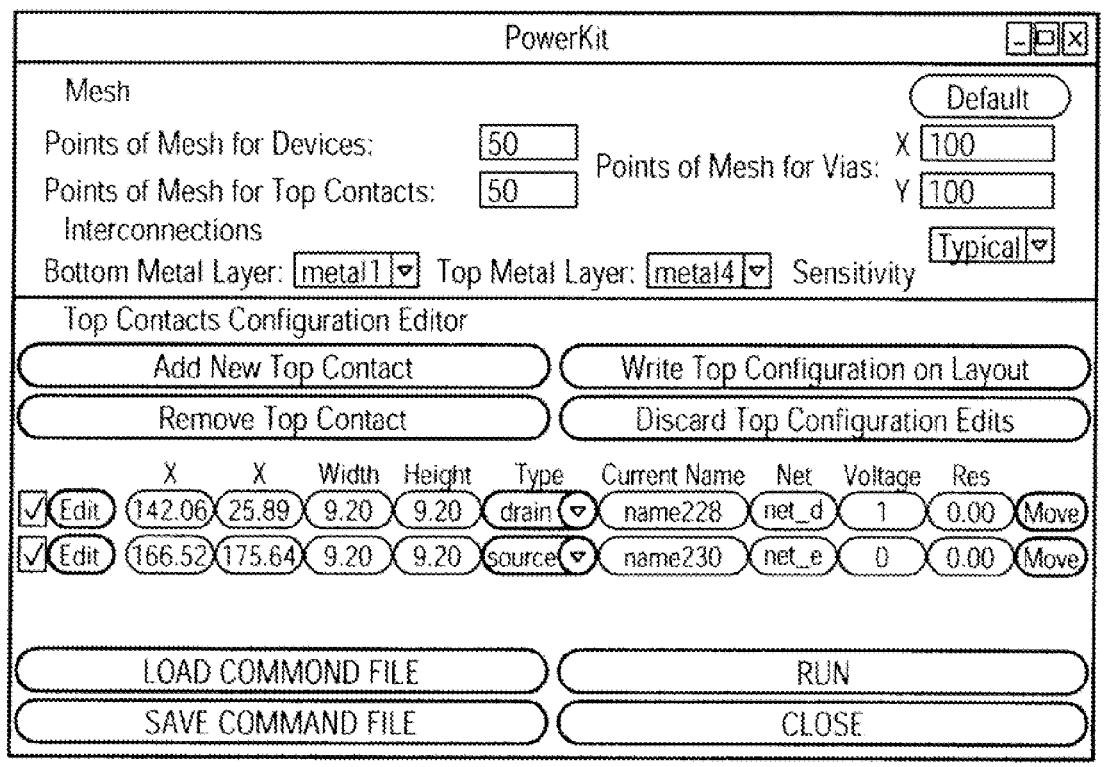
FIG. 1d schematically illustrates a representation of the graphical user interface according to illustrative embodiments.

FIG. 1d schematically illustrates a representation of the interface 150 in the form of a window represented on a monitor of the computer system 160. As illustrated, a restricted number of input parameters, such as the number of mesh points in any devices within the metallization system, the points of mesh for any top contacts of a semiconductor device, the voltage at a top contact for the drain and source regions, and the like, may be selected by the user in order to appropriately initialize the simulation tool 120. Consequently, on the basis of the input parameters selectable via the interface 150, a standardized analysis of the metallization system may be accomplished wherein the initialization of the simulation may be performed in an automated manner without requiring user interaction, except for actually initiating the simulation, for instance by selecting the run button of the interface 150. It is appreciated that a graphical representation of the interface 150 as shown in FIG. 1d is of illustrative nature only and any other representations may be used for providing interaction capabilities for the user.

Figure 1E:
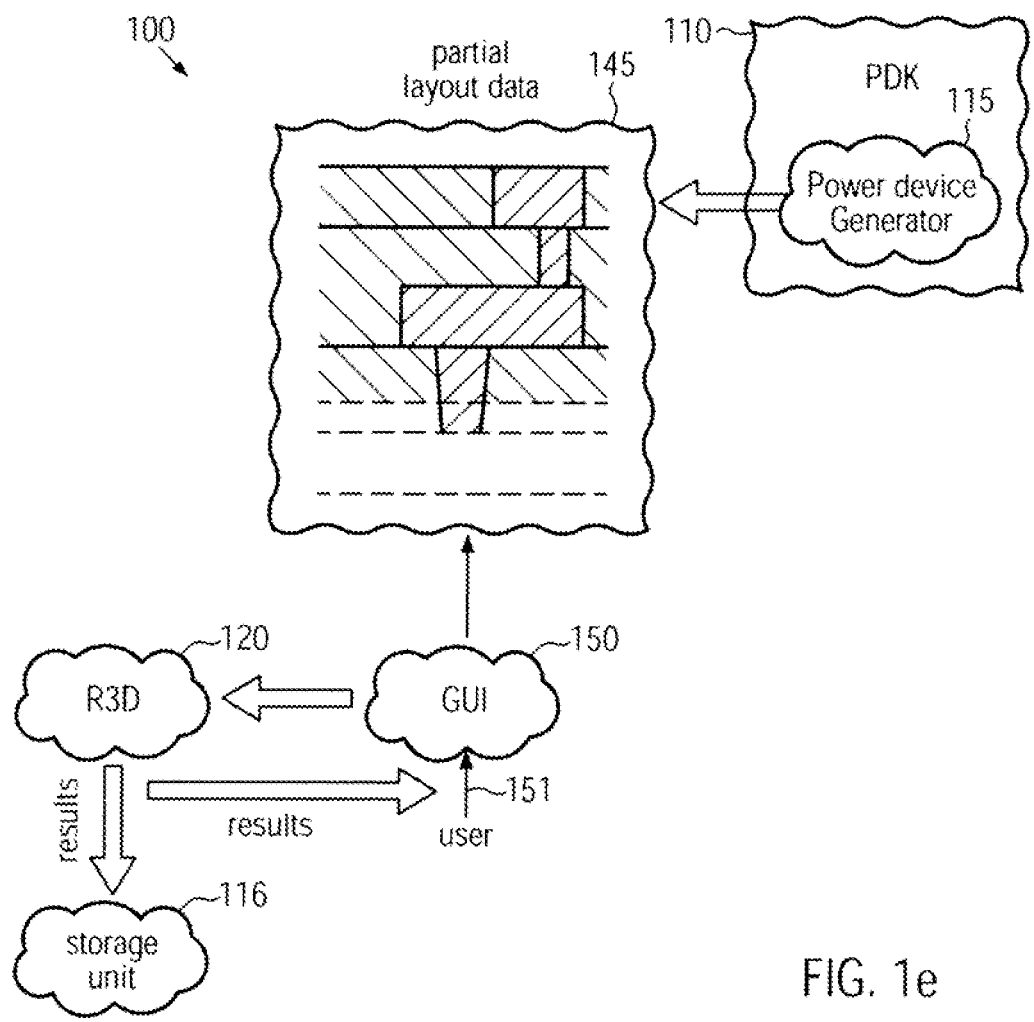
FIG. 1e schematically illustrates a portion of the design environment in which a portion of layout data is generated and used in combination with the user interface to analyze critical layout portions of a metallization system according to illustrative embodiments.

FIG. 1e schematically illustrates a portion of the design framework 100 in which the process design kit 110 is configured to provide partial layout data 145, which may represent a portion of interest of a metallization system under consideration. For example, the process design kit 110 may have implemented therein a device generator 115, for instance a device generator for providing layout data for power devices, such as high voltage transistors and the like, in combination with appropriate conductive paths in the metallization system. In some illustrative embodiments, the device generator 115 is configured to provide, for instance as an intermediate step of the layout processing, the partial layout data 145 for the metallization system only, without providing the corresponding layout data for the semiconductor-based circuit components. In this case, the layout data 145 represents a portion of interest of the metallization system, for instance of conductive paths connecting to the semiconductor-based circuit components of a power transistor, i.e., the drain and source regions and the gate electrode. In this case, the interface 150 may operate on the partial layout data 145 so as to enable establishment of a database, which may be appropriate for being operated on by the simulation tool 120. That is, since the data 145 represent the metallization system only without taking into consideration the further components of the integrated circuit, the interface 150 may provide appropriate "boundary" constraints for the restricted "semiconductor device", i.e., the portion of interest selected, in order to establish the appropriate database for the simulator 120. Since any of these boundary conditions may be independent from any technological aspects regarding the lower lying device levels or may be independent from any architecture of the power transistor, the portion of interest in the metallization system, represented by the partial layout data 145, may efficiently be used for determining or evaluating the layout obtained by the device generator 115 and using the results for creating the overall layout. Consequently, the interface 150 may initialize the simulation tool 120 on the basis of the data 145, thereby obtaining a corresponding simulation result, for instance in the form of a resistance of any conductive paths connecting to the power transistor, the electromigration behavior of the portion of interest, the temperature gradients during various operating conditions and the like. Since the simulation in the tool 120 may be established and initialized in a very efficient manner, several modifications of the layout of the portion of interest may be "screened" on the basis of corresponding modified layout data 145. That is, a plurality of different layouts can be assessed with respect to one or more given criteria, without requiring a simulation on the basis of the entire layout. Consequently, an appropriate layout for the portion of interest may be selected so as to comply with the design targets of the integrated circuit under consideration. It is appreciated that in some illustrative embodiments the layout data 145 may be obtained prior to performing any other layout processing for the remaining integrated circuit so that, in particular, the critical portions of the metallization system associated with power devices may efficiently be optimized without requiring the handling of the complete device layout.

In some illustrative embodiments a storage unit 116 is implemented in the design framework 100, for instance within the device generator 115 or within any other appropriate functional unit, in order to receive the results of the simulation tool 120 and appropriately store the results in any appropriate form, thereby enabling an efficient comparison of the various design modifications for the portion of interest of the metallization system. Thus, upon accessing the stored results the selection of a desired layout may be facilitated. For example, simulation results may be stored by the unit 116 for a plurality of different conditions, for instance in terms of modified layouts, and the like, wherein one or more characteristic result values, such as the resistance, the identification of hotspots and the like, may enable the selection of an appropriate layout so as to comply with the maximum number of preset device requirements. In some illustrative embodiments also the selection of an appropriate layout may be performed in an automated manner by identifying at least one result parameter, which may be used so as to be compared with a target value. For example, the partial layout data 145 may be created for a plurality of layouts modified in a predefined manner and the corresponding simulation results may be stored by the unit 116 and may subsequently be compared with a target value, for instance the resistance and the like, wherein the associated layout complying with the target value may then be marked as a "valid" layout. In this manner, a "multi-dimensional" screening with respect to multiple simulation result parameters of the layout may be performed without requiring any activity of a user.

Figure 1F:
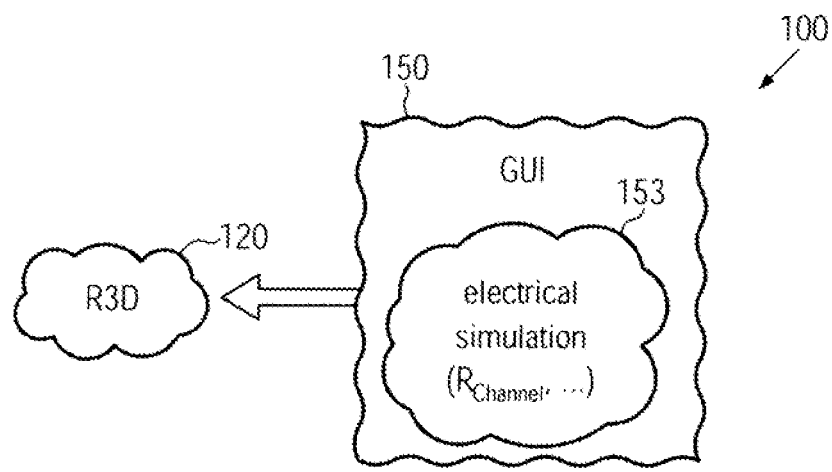
FIG. 1f schematically illustrates a part of the design framework in which required input data, such as channel resistance and the like, are provided on the basis of electrical simulation embedded in the user interface.

FIG. 1f schematically illustrates the design framework 100 according to further illustrative embodiments in which the user interface 150 is further configured to obtain one or more input parameters for the simulation tool 120 on the basis of electrical simulation. In the embodiment shown, a simulation tool 153 is embedded in the interface 150 and is configured to determine the value of a parameter based on, for instance, the circuit schematic, possibly in combination with additional technology information and the like. For example, the simulation tool 153 is configured to determine the channel resistance of a transistor, such as a power transistor, for instance based on the circuit schematic and the information contained therein and any additional information, such as a specific temperature range for operating the device under consideration and the like. Thus, the values of the one or more parameters simulated by the tool 153 may be provided to the simulation tool 120, thereby possibly replacing any corresponding parameter values which are typically provided in any of the design data 140 (cf. FIG. 1a). In other cases, the parameter values may not yet be available so that the electrical simulation by the tool 153 may provide appropriate "default" data for the simulation tool 120. For example, as discussed above, a portion of interest of a metallization system may be simulated by the tool 120, without creating design data for the rest of the integrated circuit. The simulation process may, however, also require the channel resistance of the associated power transistor wherein the corresponding design data have not yet been established, thereby saving the corresponding resources required for establishing these design data files. Hence, the simulation tool 153 may provide appropriate "default" data which may also be appropriately adapted to the simulation conditions selected by the user.

Figure 1G:
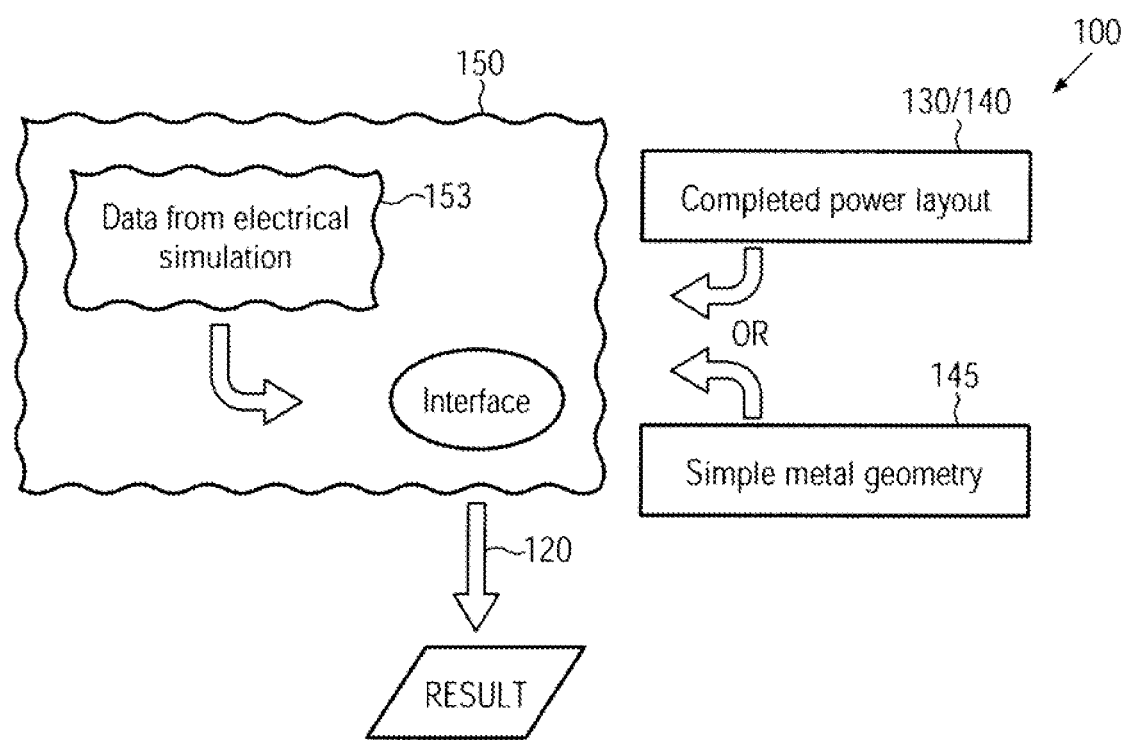
FIG. 1g schematically illustrates a part of the design framework representing a combination of previously described embodiments with respect to analyzing a complete layout, a partial layout and using electrical simulation for generating values of input parameters for various operating conditions.

FIG. 1g schematically illustrates the design framework 100 according to illustrative embodiments in which the functionality of providing simulation results on the basis of a partial simplified metal geometry and on the basis of electrical simulation of one or more input parameters may be combined. As illustrated, the interface 150 comprises the electrical simulation tool 153 which may thus provide required values of one or more input parameters, such as the channel resistance, while the interface 150 may also operate on the basis of the design data 130,140 representing a complete design of an integrated circuit under consideration, or a portion thereof, when the semiconductor-based components and the metallization system associated therewith are represented by this data. On the other hand, the interface 150 may also operate on the basis of the partial layout data 145, which may represent a portion of interest of the metallization system only, without requiring design data or any associated semiconductor-based components. Consequently, the design framework 100 as illustrated in FIG. 1g provides for a high degree of flexibility in simulating and thus analyzing the metallization system, i.e. the layout thereof, in order to determine important characteristics, such as the resistance, electromigration behavior, thermal stress and the like. Thus, based on the result obtained by the simulation tool 120, an appropriate layout may be selected with reduced process time due to the efficient initialization of the simulation 120 by means of the interface 150.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A design tool, comprising:
   a converter configured to convert a representation of an interconnection diagram for an integrated circuit into a representation of an interconnection layout for the integrated circuit, the conversion based on a functional behavior corresponding to the integrated circuit; and
   a simulator configured to simulate a characteristic of the interconnection layout.

2. The design tool of claim 1 wherein the interconnection layout is compatible with an integrated circuit platform.

3. The design tool of claim 1 wherein the converter is configured:
   to receive information regarding an integrated circuit platform; and
   in response to the information, to generate the interconnection layout such that the interconnection layout is compatible with the integrated circuit platform.

4. The design tool of claim 1 wherein the interconnection diagram comprises a schematic diagram.

5. The design tool of claim 1 wherein the interconnection layout comprises a metal integrated circuit layer.

6. The design tool of claim 1 wherein the interconnection layout comprises multiple integrated circuit layers, at least one of the layers being a metal layer.

7. The design tool of claim 1 wherein the representation of the interconnection diagram and the representation of the interconnection layout respectively comprise an interconnection net list and an interconnection mesh list.

8. The design tool of claim 1 wherein the characteristic comprises a current through a portion of the interconnection layout.

9. The design tool of claim 1 wherein the characteristic comprises a current density at a portion of the interconnection layout.

10. The design tool of claim 1 wherein the characteristic comprises a voltage across a portion of the interconnection layout.

11. The design tool of claim 1 wherein the characteristic comprises a temperature at a portion of the interconnection layout.

12. The design tool of claim 1 wherein the characteristic comprises an impedance across a portion of the interconnection layout.

13. The design tool of claim 1 wherein the characteristic comprises electromigration at a portion of the interconnection layout.

14. The design tool of claim 1 wherein the representation of the interconnection layout includes a dimension of a portion of the interconnection layout.

15. The design tool of claim 1 wherein the representation of the interconnection layout includes a relative location of a portion of the interconnection layout.

16. The design tool of claim 1 wherein the representation of the interconnection layout includes a layer of the integrated circuit in which a portion of the interconnection layout is located.

17. The design tool of claim 1 wherein the representation of the interconnection layout includes a relative orientation of a portion of the interconnection layout.

18. The design tool of claim 1 wherein the representation of the interconnection layout includes a distance between first and second portions of the interconnection layout.

19. The design tool of claim 1 wherein the representation of the interconnection layout includes a material of a portion of the interconnection layout.

20. The design tool of claim 1 wherein:
   the interconnection diagram comprises a diagrammatic interconnection to a node of a component of the integrated circuit; and
   the interconnection layout comprises a physical interconnection to the node of the component.

21. The design tool of claim 1 wherein the simulator is configured to simulate the characteristic of the interconnection layout in response to a characteristic of an integrated circuit component to which the interconnection layout is coupled.

22. The design tool of claim 1 wherein the simulator is configured:
   to receive a characteristic of an integrated circuit component to which the interconnection layout is coupled; and
   to simulate the characteristic of the interconnection layout in response to the characteristic of the component.

23. The design tool of claim 1 wherein the simulator is configured:
   to receive an operating condition of the integrated circuit; and
   to simulate the characteristic of the interconnection layout in response to the received operating condition of the integrated circuit.

24. The design tool of claim 1 wherein the simulator is configured:
   to receive an operating voltage of the integrated circuit; and
   to simulate the characteristic of the interconnection layout in response to the received operating voltage of the integrated circuit.

25. The design tool of claim 1 wherein:
   the converter is configured to convert the representation of the interconnection diagram for the integrated circuit into representations of different interconnection layouts for the integrated circuit; and
   the simulator is configured to simulate a same characteristic of each of the interconnection layouts and to store the respective simulated characteristics for each of the interconnection layouts.

26. The design tool of claim 1 wherein:
   the converter is configured to convert the representation of the interconnection diagram for the integrated circuit into representations of different interconnection layouts for the integrated circuit; and
   the simulator is configured to simulate a same characteristic of each of the interconnection layouts, to analyze the respective simulated characteristics for each of the interconnection layouts, and to select one of the interconnection layouts based on the analysis.

27. The design tool of claim 1 wherein the converter is further configured:
   to convert a representation of a component diagram for the integrated circuit into a representation of a component layout for the integrated circuit, and
   to generate from the representations of the interconnection and component layouts a representation of a circuit layout for the integrated circuit; and
   the simulator is further configured to simulate a characteristic of the circuit layout.

28. The design tool of claim 1 wherein the converter is further configured
   to convert a representation of a component symbol for the integrated circuit into a representation of a component layout for the integrated circuit, and
   to generate from the representations of the interconnection and component layouts a representation of a circuit layout for the integrated circuit; and the simulator is further configured to simulate a characteristic of the circuit layout.

29. The design tool of claim 1 wherein the converter is further configured
- to convert a representation of a transistor of the integrated circuit into a representation of a transistor layout for the integrated circuit, and
- to generate from the representations of the interconnection and transistor layouts a representation of a circuit layout for the integrated circuit; and
- the simulator is further configured to simulate a characteristic of the circuit layout.

30. A method, comprising:
- retrieving a parameter of a functional behavior corresponding to an integrated circuit;
- generating, with a processor, a representation of an interconnection layout for an integrated circuit in response to a representation of an interconnection diagram for the integrated circuit and in response to the retrieved parameter; and
- simulating a characteristic of the interconnection layout.

31. The method of claim 30, further comprising receiving the representation of the interconnection diagram from a user interface.

32. The method of claim 30 wherein the interconnection diagram includes a diagram of an interconnection to a component of the integrated circuit.

33. The method of claim 30 wherein:
- the interconnection diagram includes a diagram of an interconnection to a component of the integrated circuit; and
- the interconnection layout includes a layout of an interconnection to the component.

34. The method of claim 30 wherein:
- the interconnection diagram includes a diagram of an interconnection to a component of the integrated circuit and lacks a diagram of the component; and
- the interconnection layout includes a layout of an interconnection to the component.

35. The method of claim 30 wherein:
- the interconnection diagram includes a diagram of an interconnection to a component of the integrated circuit; and
- the interconnection layout includes a layout of an interconnection to the component and lacks a layout of the component.

36. The method of claim 30 wherein the interconnection diagram comprises a schematic diagram of the integrated circuit.

37. The method of claim 30, further comprising extracting the representation of the interconnection diagram from a representation of a schematic diagram of the integrated circuit.

38. The method of claim 30 wherein the interconnection layout is three dimensional.

39. The method of claim 30 wherein generating the representation of the interconnection layout comprises generating the representation of the interconnection layout in response to a representation of a process node according to which the integrated circuit may be formed.

40. The method of claim 30 wherein generating the representation of the interconnection layout comprises generating the representation of the interconnection layout in response to a representation of a platform according to which the integrated circuit may be instantiated.

41. The method of claim 30, further comprising:
- generating a representation of a component layout for the integrated circuit in response to a representation of a component diagram;
- merging the representation of the interconnection layout with the representation of the component layout to form a representation of a circuit layout for the integrated circuit; and
- simulating a characteristic of the circuit layout.

42. A non-transitory computer readable medium storing instructions that, when executed, cause a computing circuit:
- to retrieve a parameter of a functional behavior corresponding to an integrated circuit;
- to generate a representation of an interconnection layout for an integrated circuit in response to a representation of an interconnection diagram for the integrated circuit and in response to the retrieved parameter; and
- to simulate a characteristic of the interconnection layout.

* * * * *